(12) United States Patent
Lu et al.

(10) Patent No.: US 12,165,874 B2
(45) Date of Patent: Dec. 10, 2024

(54) SEMICONDUCTOR STRUCTURE AND FORMING METHOD THEREOF

(71) Applicant: CHANGXIN MEMORY TECHNOLOGIES, INC., Hefei (CN)

(72) Inventors: Jingwen Lu, Hefei (CN); Bingyu Zhu, Hefei (CN); Zhaopei Cui, Hefei (CN); Wei Feng, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 480 days.

(21) Appl. No.: 17/650,983

(22) Filed: Feb. 14, 2022

(65) Prior Publication Data

US 2022/0375757 A1 Nov. 24, 2022

Related U.S. Application Data

(63) Continuation of application No. PCT/CN2021/120290, filed on Sep. 24, 2021.

(30) Foreign Application Priority Data

May 19, 2021 (CN) .......................... 202110548237.3

(51) Int. Cl.
*H01L 21/308* (2006.01)
*H10B 12/00* (2023.01)
(52) U.S. Cl.
CPC ....... *H01L 21/3086* (2013.01); *H10B 12/482* (2023.02); *H10B 12/488* (2023.02); *H01L 21/3088* (2013.01)

(58) Field of Classification Search
CPC ........... H01L 21/3088; H01L 27/10885; H01L 27/10891; H10B 12/488
See application file for complete search history.

(56) References Cited

U.S. PATENT DOCUMENTS 8,697,316 B2    4/2014    Wang
9,524,870 B2    12/2016    Kang et al.
9,607,885 B2    3/2017    Zhang et al.
(Continued)

FOREIGN PATENT DOCUMENTS

CN    103489839 A    1/2014
CN    105762070 A    7/2016
(Continued)

*Primary Examiner* — Walter H Swanson
(74) *Attorney, Agent, or Firm* — Syncoda LLC; Feng Ma

(57) ABSTRACT

A forming method of a semiconductor structure includes the following: providing a semiconductor substrate formed with a first mask layer having a preset pattern; forming a second mask layer having a first mask pattern on a surface of the first mask layer, wherein the first mask pattern includes a plurality of first sub-patterns arranged in sequence; forming a second mask pattern in the second mask layer through the first mask pattern in a self-alignment manner, wherein the second mask pattern includes the first sub-patterns of the first mask pattern and second sub-patterns corresponding to the first sub-patterns; etching the first mask layer based on the first sub-patterns and the second sub-patterns of the second mask pattern to convert the preset pattern into an active area pattern; and defining active areas in the semiconductor substrate based on the active area pattern.

16 Claims, 29 Drawing Sheets

(56) References Cited

U.S. PATENT DOCUMENTS

| | | |
|---|---|---|
| 9,911,605 B2 | 3/2018 | Heo et al. |
| 10,141,316 B2 | 11/2018 | Lee et al. |
| 10,522,550 B2 | 12/2019 | Lee et al. |
| 10,600,688 B2 | 3/2020 | Zhang et al. |
| 2006/0273456 A1* | 12/2006 | Sant .................... H01L 21/0337 257/734 |
| 2006/0284259 A1 | 12/2006 | Lee |
| 2013/0330660 A1 | 12/2013 | Wang |
| 2014/0306352 A1 | 10/2014 | Zhang et al. |
| 2016/0196982 A1 | 7/2016 | Kang et al. |
| 2017/0200725 A1 | 7/2017 | Lee et al. |
| 2017/0271149 A1 | 9/2017 | Heo et al. |
| 2019/0074219 A1 | 3/2019 | Zhang et al. |
| 2019/0088659 A1 | 3/2019 | Lee et al. |
| 2020/0373309 A1 | 11/2020 | Teo |

FOREIGN PATENT DOCUMENTS

| | | |
|---|---|---|
| CN | 107221492 A | 9/2017 |
| CN | 109585279 A | 4/2019 |
| CN | 111524886 A | 8/2020 |
| CN | 112071744 A | 12/2020 |
| CN | 112768352 A | 5/2021 |
| WO | 2019050735 A1 | 3/2019 |

\* cited by examiner

SEMICONDUCTOR STRUCTURE AND FORMING METHOD THEREOF

CROSS-REFERENCE TO RELATED APPLICATIONS

This is a continuation of International Application No. PCT/CN2021/120290 filed on Sep. 24, 2021, which claims priority to Chinese Patent Application No. 202110548237.3 filed on May 19, 2021. The disclosures of these applications are hereby incorporated by reference in their entirety.

BACKGROUND

In a semiconductor structure, such as a Dynamic Random Access Memory (DRAM), it is often necessary to define Active Areas (AA) in a substrate and to manufacture corresponding device units in the active areas. The active areas are usually manufactured in the substrate using two masks in succession, therefore the alignment between the two masks is particularly important. The misalignment of either mask will cause malposition and connection of adjacent AAs.

SUMMARY

Embodiments of the disclosure relate to the field of semiconductor technologies, more particularly, to a semiconductor structure and a forming method thereof.

In a first aspect, the embodiments of the disclosure provide a forming method of a semiconductor structure. The forming method of the semiconductor structure includes: providing a semiconductor substrate, on which a first mask layer having a preset pattern is formed; forming, on a surface of the first mask layer, a second mask layer having a first mask pattern, wherein the first mask pattern comprises a plurality of first sub-patterns arranged in sequence; forming, in the second mask layer, a second mask pattern through the first mask pattern in a self-alignment manner, wherein the second mask pattern comprises the first sub-patterns of the first mask pattern and second sub-patterns corresponding to the first sub-patterns; etching the first mask layer based on the first sub-patterns and the second sub-patterns of the second mask pattern to convert the preset pattern into an active area pattern; and defining, based on the active area pattern, a plurality of active areas in the semiconductor substrate.

In a second aspect, the embodiments of the disclosure further provide a semiconductor structure. The semiconductor structure includes: a plurality of active areas formed in a semiconductor substrate, the plurality of active areas being formed by the forming method of the semiconductor structure in the first aspect; a plurality of word lines, the plurality of word lines being intersected with the plurality of active areas in a word line extension direction; and a plurality of bit lines, the plurality of bit lines being intersected with the plurality of active areas in a bit line extension direction.

BRIEF DESCRIPTION OF THE DRAWINGS

In the drawings (which are not necessarily drawn to scale), same reference numerals may designate the same elements from different views. Similar reference numerals with different letter suffixes may denote different examples of similar elements. Embodiments discussed herein are illustrated by the drawings by way of example and not limitation.

DETAILED DESCRIPTION

The specific technical solution of the disclosure will be further described in detail below with reference to the drawings of the embodiments of the disclosure. The following embodiments are merely used to illustrate the disclosure, but are not intended to limit the scope of the disclosure.

In the following description, suffixes such as "module" or "unit" used to denote elements are merely used to facilitate the description of the disclosure and have no specific meaning per se. Therefore, "module" or "unit" may be used interchangeably.

In a semiconductor structure, such as a DRAM, it is often necessary to define active areas in a substrate and to manufacture corresponding devices in the active areas. The process for forming the active areas according to embodiments of the disclosure will be described below with reference to FIGS. 1A to 1E.

In some embodiments, the process for forming the active areas includes the following operations.

A mask layer provided having an initial mask pattern is formed on a surface of a substrate.

Figure 1A:
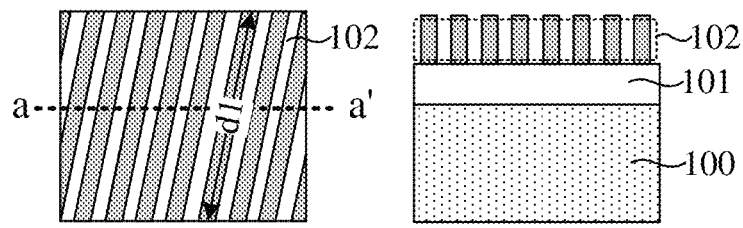
FIG. 1A illustrates a schematic structural diagram of forming a mask layer on a surface of a substrate.

FIG. 1A illustrates a schematic structural diagram of forming the mask layer on the surface of the substrate. The left figure in FIG. 1A illustrates a diagram from top view of forming the mask layer, and the right figure in FIG. 1A illustrates a schematic structural diagram from cross-sectional view along a dashed line a-a' after the mask layer is formed. As shown in FIG. 1A, a barrier layer 101 and the mask layer 102 are formed on the surface of the substrate 100, the mask layer is provided with the initial mask pattern including multiple strip patterns having a first dimension d1, any two adjacent strip patterns having the first dimension are parallel to each other, and the first dimension d1 is a dimension in a direction perpendicular to an arrangement direction of the strip patterns. The barrier layer 101 is used as a mask to etch the substrate 100 in the subsequent processes and to protect the substrate 100 before an active area pattern is defined.

The mask layer is etched by adopting a first mask having a first preset pattern to convert the initial mask pattern of the mask layer into the first preset pattern.

Figure 1B:
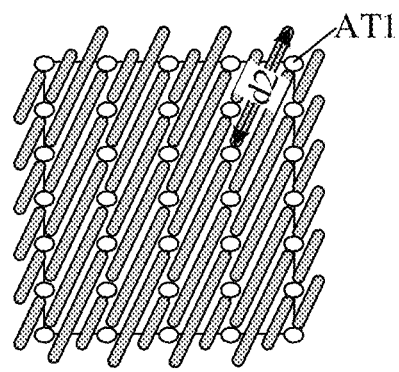
FIG. 1B illustrates a diagram from top view of etching a mask layer by adopting a first mask.

FIG. 1B illustrates a diagram from top view of etching the mask layer by adopting the first mask. As shown in FIG. 1B, the first preset pattern includes uniformly arranged circular holes. The mask layer is etched through the first mask AT1 provided with uniformly arranged circular holes, and each strip pattern having the first dimension d1 in the mask layer is uniformly divided to obtain multiple discontinuous strip patterns having a second dimension d2, so as to convert the initial mask pattern of the mask layer into the first preset pattern. The second dimension and the first dimension are dimensions in the same direction, and the second dimension is at least less than half of the first dimension.

The mask layer is further etched by adopting a second mask having a second preset pattern to convert the first preset pattern into the second preset pattern.

Figure 1C:
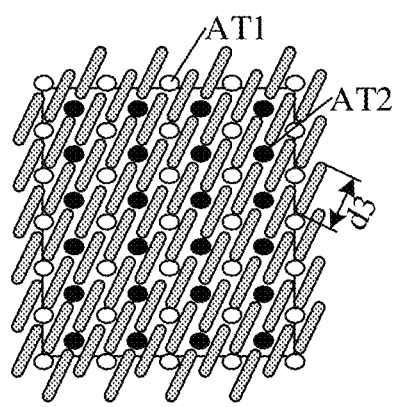
FIG. 1C illustrates a diagram from top view of etching a mask layer by adopting a second mask.

FIG. 1C illustrates a diagram from top view of etching the mask layer by adopting the second mask. As shown in FIG. 1C, the second preset pattern also includes uniformly arranged circular holes, and each of the circular holes in the second preset pattern is located at the center of every four circular holes, that are pairwise adjacent, of the first preset pattern. The mask layer is etched through the second mask AT2 having uniformly arranged circular holes, and each strip pattern having the second dimension d2 in the mask layer is uniformly divided to obtain multiple discontinuous strip patterns having a third dimension d3, so as to convert the first preset pattern of the mask layer into the second preset pattern. The third dimension and the second dimension are dimensions in the same direction, and the third dimension is at least less than half of the second dimension.

Figure 1D:
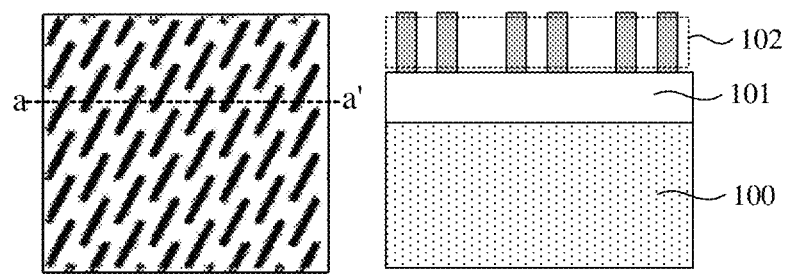
FIG. 1D illustrates a diagram from top view and a cross-sectional structural diagram of a mask layer etched through a first mask and a second mask.

FIG. 1D illustrates a diagram from top view and a cross-sectional structural diagram of the mask layer etched through the first mask and the second mask. The left figure in FIG. 1D illustrates a diagram from top view of the etched mask layer, and the right figure in FIG. 1D illustrates a cross-sectional structural diagram of the etched mask layer along a dashed line a-a'. As shown in FIG. 1D, the mask layer 102 is etched through the first mask and the second mask in sequence, and the initial mask pattern is converted into the second mask pattern, and the second mask pattern is a pattern for finally forming active areas.

The substrate is etched by adopting the second mask pattern to form active areas in the substrate.

Figure 1E:
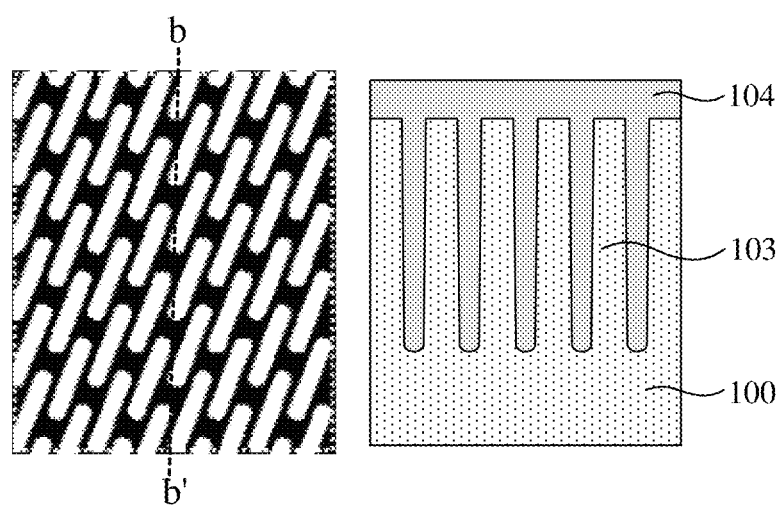
FIG. 1E illustrates a diagram from top view and a cross-sectional structural diagram of forming active areas in a substrate.

FIG. 1E illustrates a diagram from top view and a cross-sectional structural diagram of forming the active areas in the substrate. The left figure in FIG. 1E illustrates a diagram from top view of forming the active areas, and the right figure in FIG. 1E illustrates a cross-sectional structural diagram along a dashed line b-b' after the active areas are formed. As shown in FIG. 1E, the active areas 103 are formed on the substrate 100 by etching the substrate through the second mask pattern. After the substrate is etched to form the active areas 103, $SiO_2$ is deposited on the surfaces of the active areas to form an isolation layer 104 so as to protect the active areas.

However, when the second mask is used to etch the mask layer which has been etched through the first mask, the second mask cannot be perfectly aligned with the first mask due to fact that the current lithography resolution is not high, and in the case where there is a slight deviation between the second mask and the first mask, it will lead to malposition or connection of adjacent active areas being formed, or it will lead to the formation of active areas having inconsistent dimensions, thereby affecting the electrical properties of the manufactured semiconductor structure.

To solve the foregoing problems, embodiments of the disclosure provide a forming method of a semiconductor structure and the semiconductor structure. In the embodiments of the disclosure, only one mask is adopted to form a final active area pattern through the self-alignment technology, so that the problem of malposition or connection of adjacent active areas is avoided.

High-resolution lithography technology is particularly important when the process for forming a semiconductor is miniaturized, and Self-aligned Double Patterning (SADP) technology may play a great role when the lithography resolution is not high.

Figure 2:
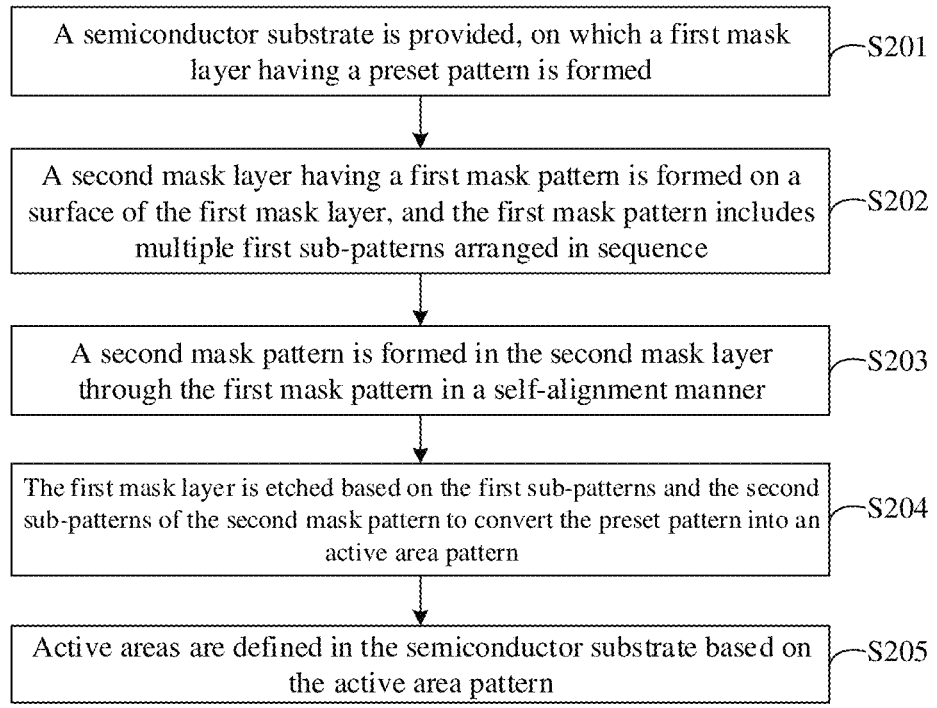
FIG. 2 illustrates an alternative schematic flow chart of a forming method of a semiconductor structure according to an embodiment of the disclosure.

Based on this, embodiments of the disclosure provide a forming method of a semiconductor structure. FIG. 2 illustrates an alternative schematic flow chart of the forming method of the semiconductor structure according to the embodiments of the disclosure. As shown in FIG. 2, the forming method of the semiconductor structure includes the following operations.

At S201: a semiconductor substrate is provided, on which a first mask layer having a preset pattern is formed.

At S202: a second mask layer having a first mask pattern is formed on a surface of the first mask layer.

The first mask pattern includes multiple first sub-patterns arranged in sequence.

At S203: a second mask pattern is formed in the second mask layer through the first mask pattern in a self-alignment manner.

The second mask pattern includes the first sub-patterns of the first mask pattern and second sub-patterns corresponding to the first sub-patterns.

At S204: the first mask layer is etched based on the first sub-patterns and the second sub-patterns of the second mask pattern to convert the preset pattern into an active area pattern.

At S205: active areas are defined in the semiconductor substrate based on the active area pattern.

Figure 3A:
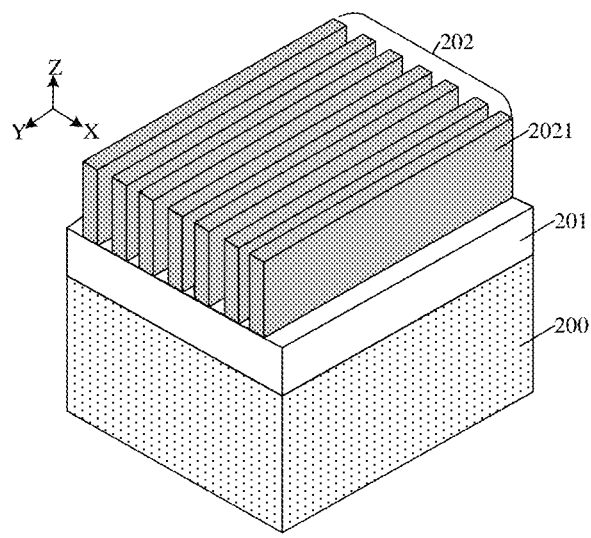
FIG. 3A illustrates a schematic structural diagram of a semiconductor substrate and a first mask layer according to an embodiment of the disclosure.
Figure 3B:
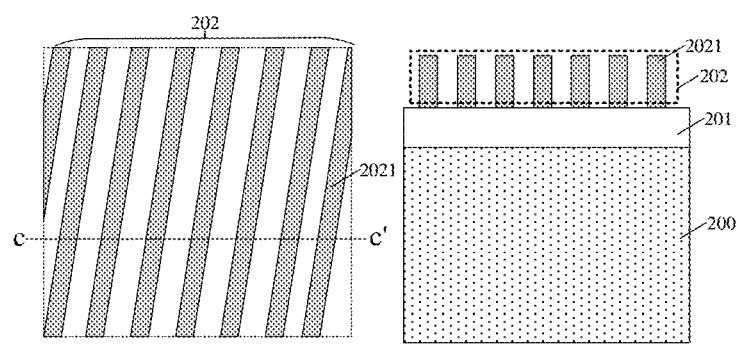
FIG. 3B illustrates a diagram from top view and a cross-sectional structural diagram of a semiconductor substrate and a first mask layer according to an embodiment of the disclosure.
Figure 3C:
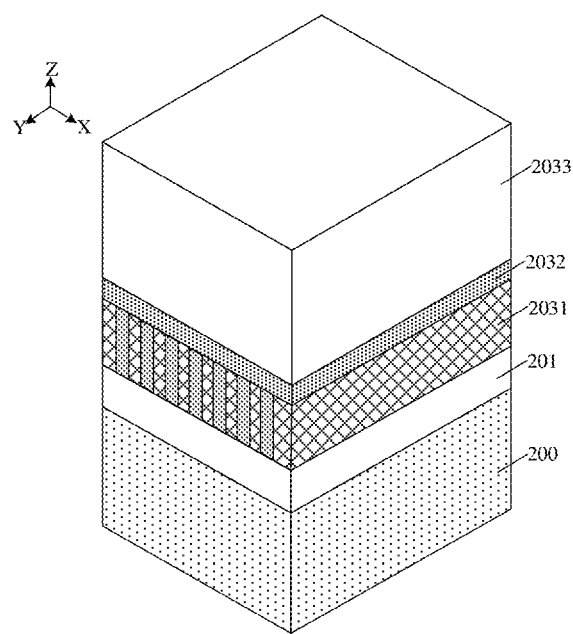
FIG. 3C illustrates a schematic structural diagram of forming a second mask layer according to an embodiment of the disclosure.
Figure 3D:
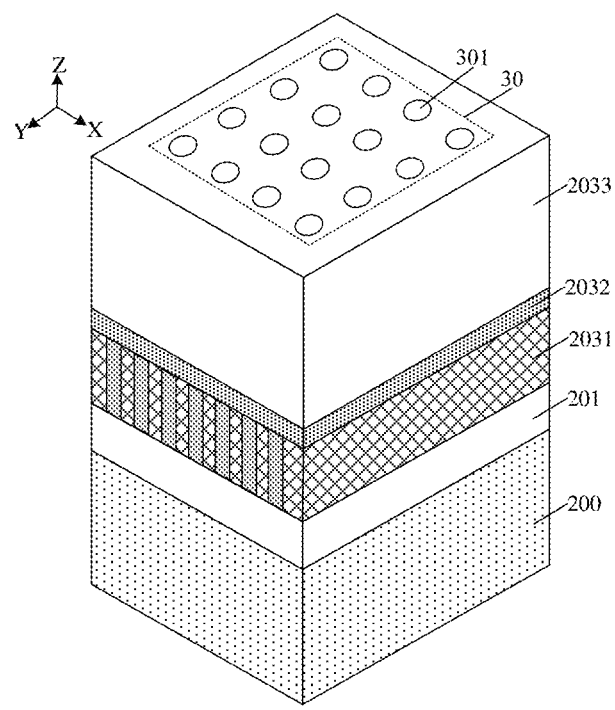
FIG. 3D illustrates a schematic structural diagram of forming a first mask pattern in a second mask layer according to an embodiment of the disclosure.
Figure 3E:
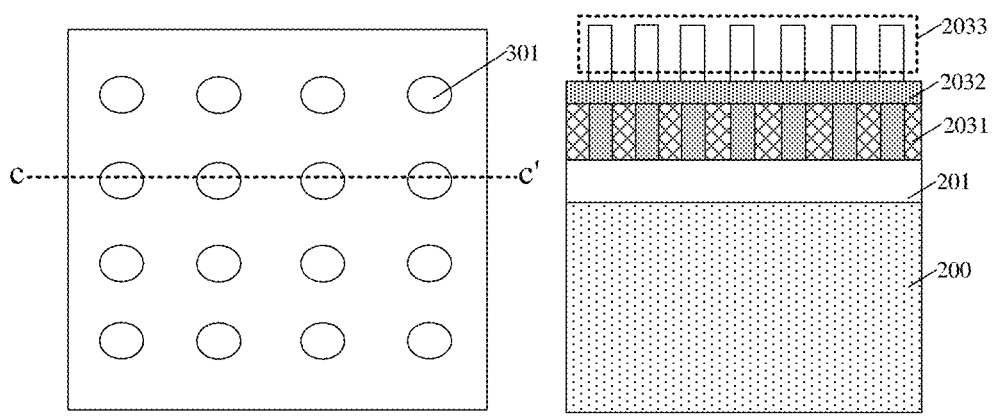
FIG. 3E illustrates a diagram from top view and a cross-sectional structural diagram of forming a first mask pattern in a second mask layer according to an embodiment of the disclosure.
Figure 3F:
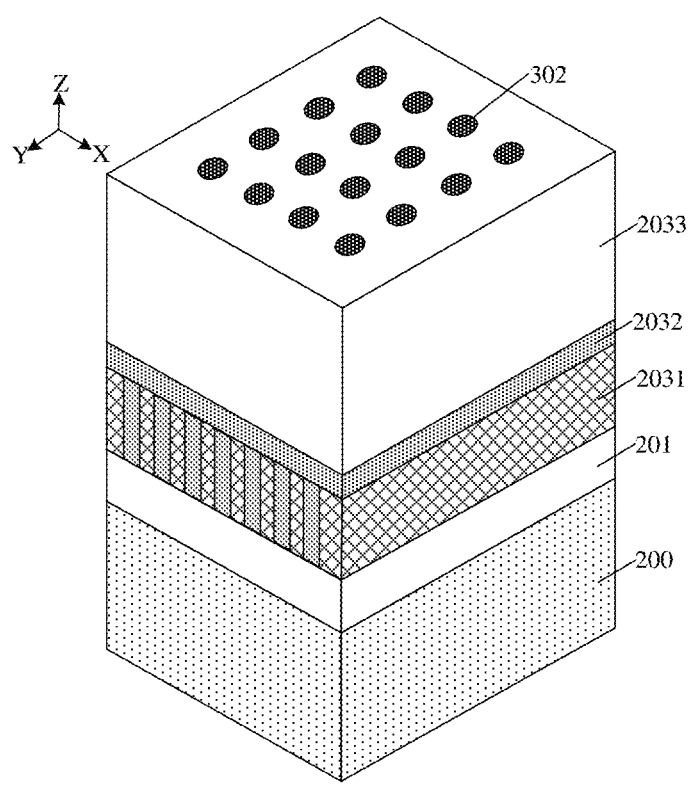
FIG. 3F illustrates a schematic structural diagram of forming first material pillars according to an embodiment of the disclosure.
Figure 3G:
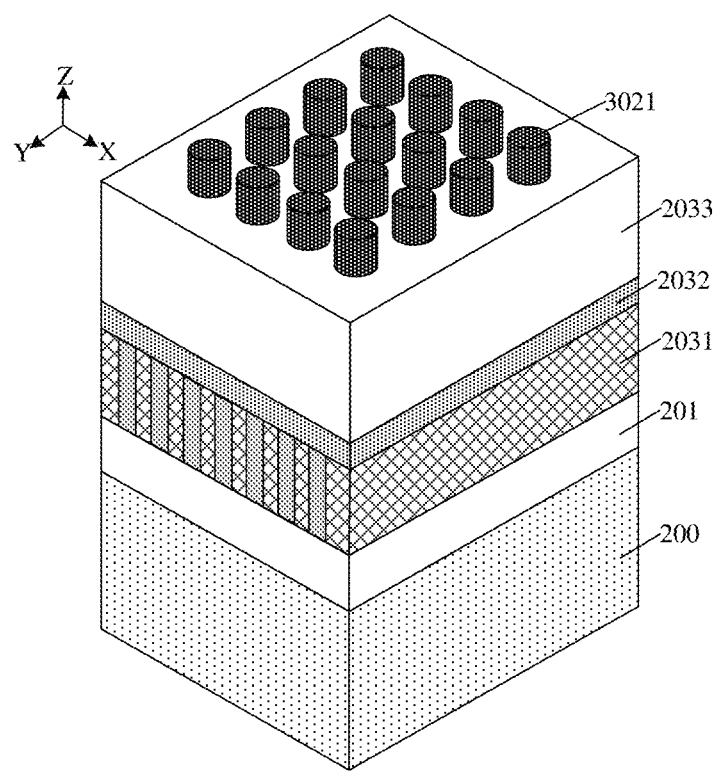
FIG. 3G illustrates a schematic structural diagram of forming first material pillars having a preset height according to an embodiment of the disclosure.
Figure 3H:
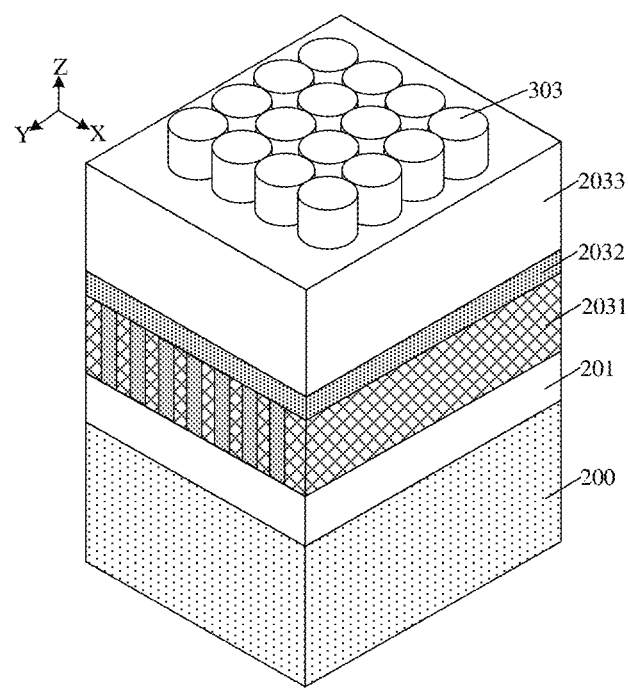
FIG. 3H illustrates a schematic structural diagram of forming insulating material pillars according to an embodiment of the disclosure.
Figure 3I:
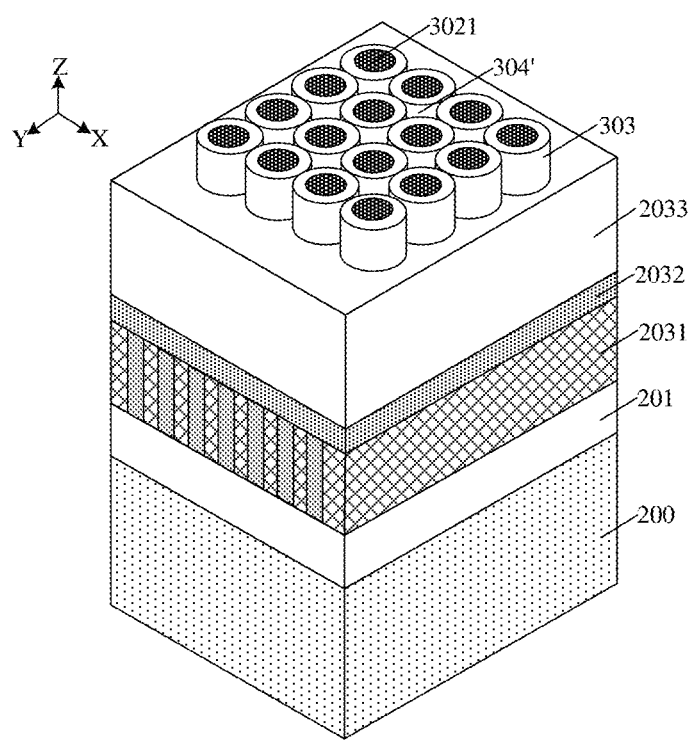
FIG. 3I illustrates a schematic structural diagram of etching insulating material pillars according to an embodiment of the disclosure.
Figure 3J:
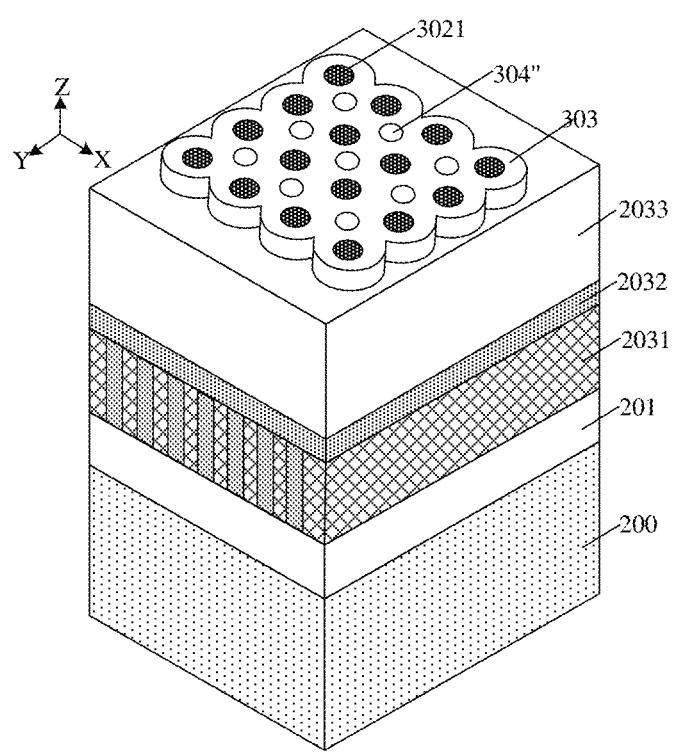
FIG. 3J illustrates a schematic structural diagram of etching insulating material pillars and first material pillars simultaneously according to an embodiment of the disclosure.
Figure 3K:
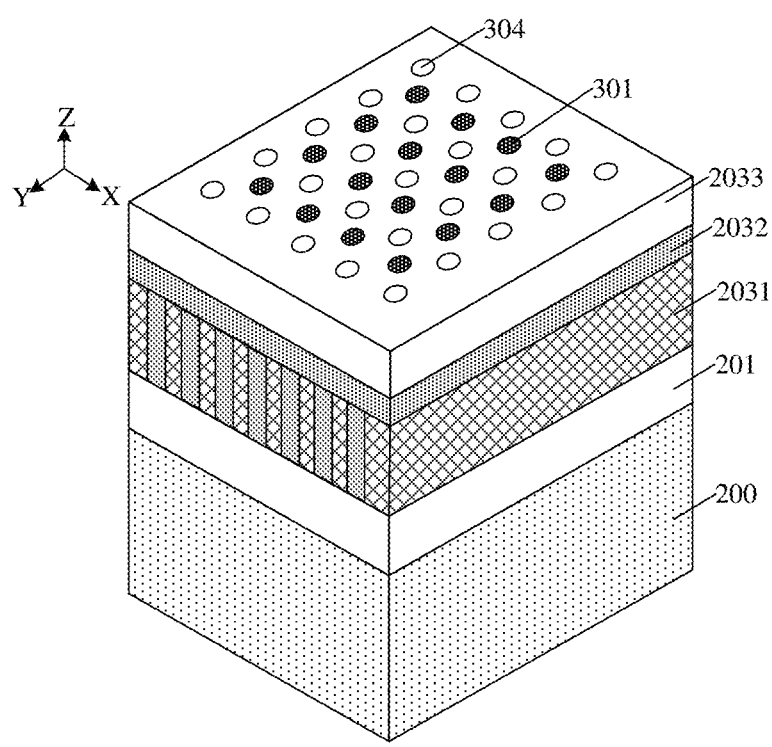
FIG. 3K illustrates a schematic structural diagram of forming second etched holes having a preset diameter according to an embodiment of the disclosure.
Figure 3L:
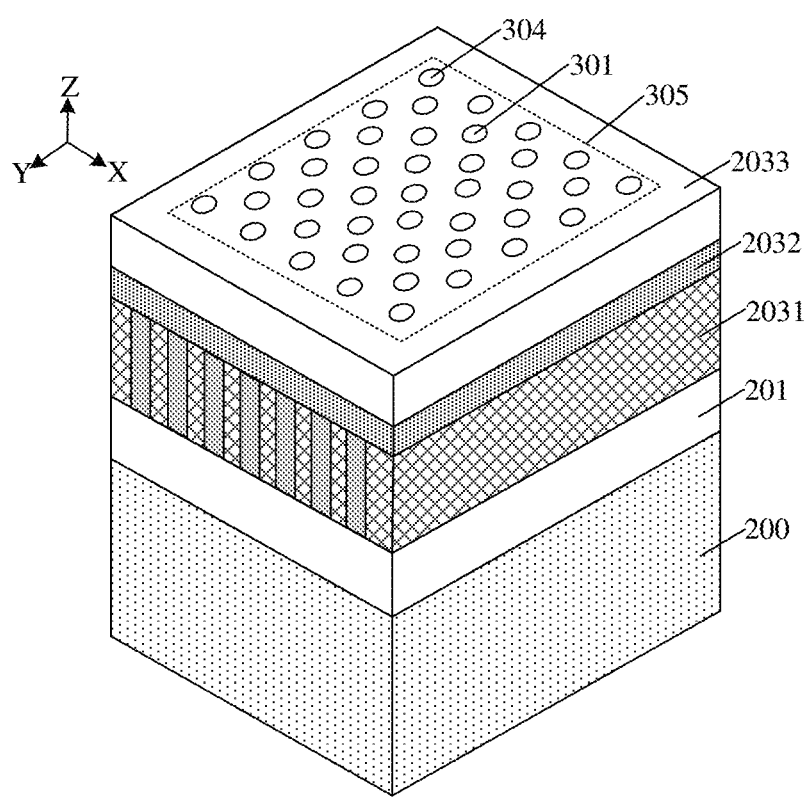
FIG. 3L illustrates a schematic structural diagram of etching to remove a first material in etched holes according to an embodiment of the disclosure.
Figure 3M:
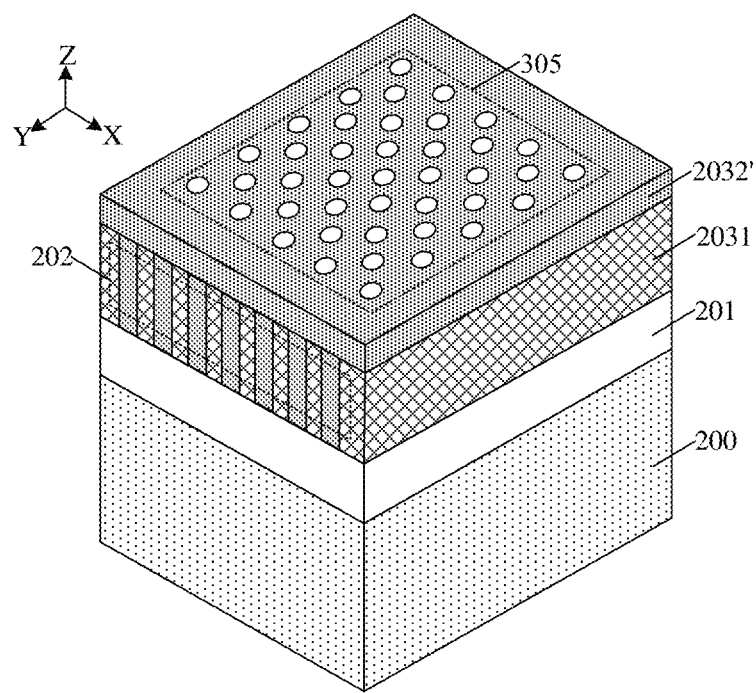
FIG. 3M illustrates a schematic structural diagram of etching a barrier layer according to an embodiment of the disclosure.
Figure 3N:
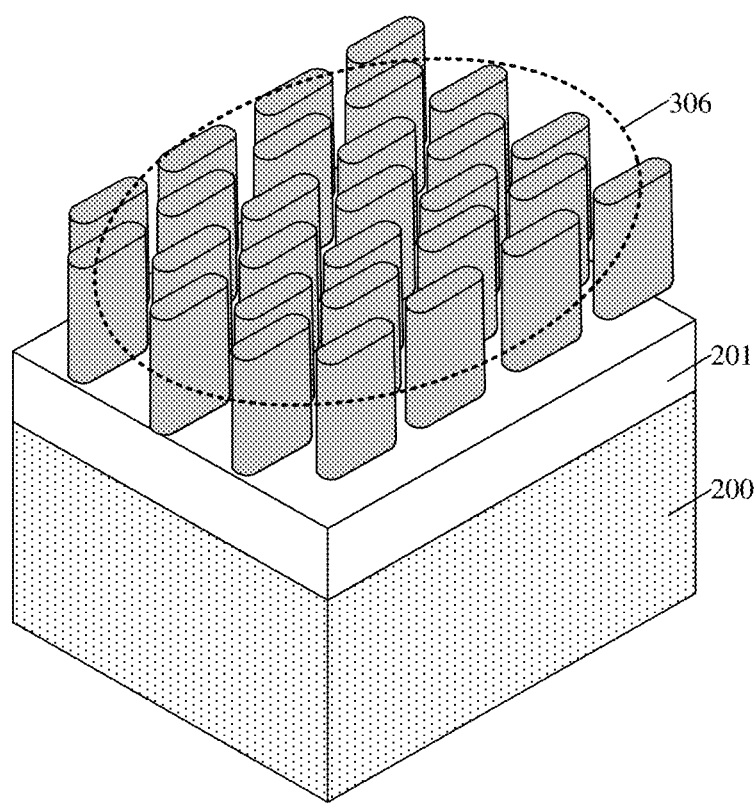
FIG. 3N illustrates a schematic structural diagram of forming an active area pattern according to an embodiment of the disclosure.
Figure 3O:
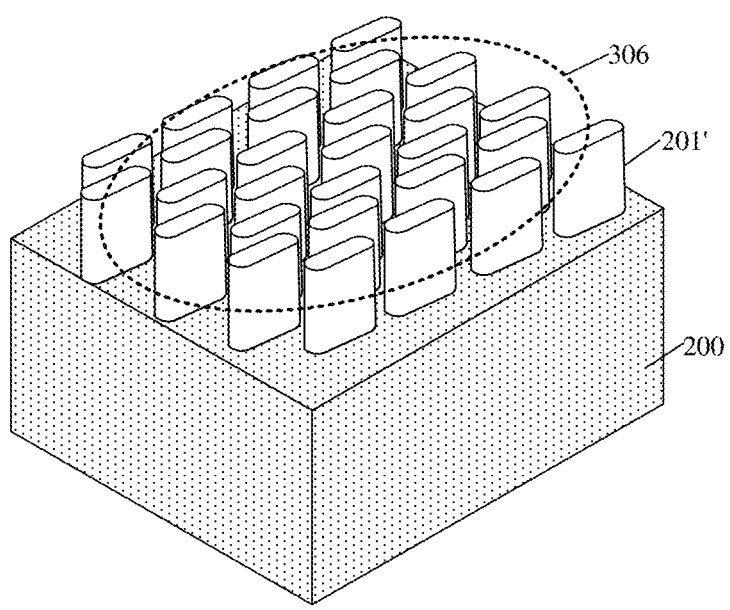
FIG. 3O illustrates a schematic structural diagram of etching an isolation layer according to an embodiment of the disclosure.
Figure 3P:
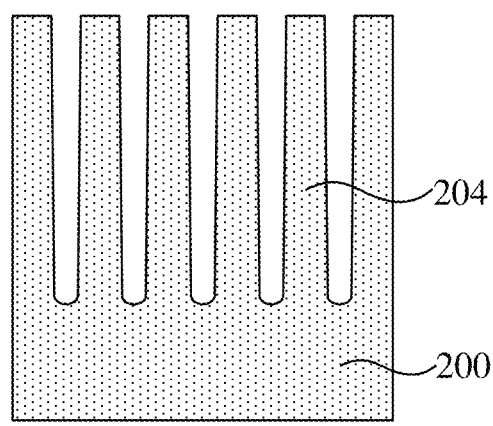
FIG. 3P illustrates a schematic structural diagram from cross-sectional view of forming active areas in a semiconductor substrate according to an embodiment of the disclosure.

The forming method of the semiconductor structure according to the embodiments of the disclosure will be further described in detail below with reference to the schematic structural diagrams of the process for forming the semiconductor structure as shown in FIGS. 3A to 3P.

First of all, with reference to FIG. 3A and FIG. 3B, operation S201 is performed to provide a semiconductor substrate on which a first mask layer having a preset pattern is formed.

The material of the semiconductor substrate may be any one of silicon (Si), silicon germanium (SiGe), silicon carbide (SiC), aluminum oxide ($Al_2O_3$), aluminum nitride (AlN), zinc oxide (ZnO), gallium oxide ($Ga_2O_3$), lithium aluminate ($LiAlO_2$) and the like. A Si substrate is taken as an example according to the embodiments of the disclosure. The first mask layer may be a polysilicon layer, or a layer of any other material, such as a silicon oxide layer, a silicon nitride layer, etc. According to the embodiments of the disclosure, the material of the first mask layer is not limited herein.

According to some embodiments, an isolation layer is further arranged between the semiconductor substrate and the first mask layer, and the isolation layer is taken as an etching mask to etch the semiconductor substrate in the subsequent process and to protect the semiconductor substrate before active areas are defined in the semiconductor substrate.

FIG. 3A illustrates a schematic structural diagram of the semiconductor substrate and the first mask layer according to the embodiments of the disclosure, and FIG. 3B illustrates a diagram from top view and a cross-sectional structural diagram of the semiconductor substrate and the first mask layer according to the embodiments of the disclosure. The left figure in FIG. 3B illustrates the diagram from top view of the first mask layer and the semiconductor substrate, and the right figure in FIG. 3B illustrates the cross-sectional structural diagram of the first mask layer and the semiconductor substrate along a dashed line c-c'. As shown in FIG. 3A and FIG. 3B, the isolation layer 201 is formed on the semiconductor substrate 200, and the first mask layer 202 is formed on the isolation layer 201, and the first mask layer 202 includes multiple polysilicon strips 2021 parallel to each other.

The semiconductor substrate may include a top surface on the front and a bottom surface on the back opposite to the front. A direction perpendicular to the top and bottom surfaces of the substrate is defined as a third direction on condition that the flatness of the top and bottom surfaces is ignored. A first direction and a second direction intersected with each other (e.g., perpendicular to each other) are defined in the plane parallel to the top and bottom surfaces of the substrate (i.e. a plane on which the substrate is located). For example, the arrangement direction of the multiple polysilicon strips 2021 may be defined as the first direction, and a plane direction of the semiconductor substrate may be determined based on the first and second directions. The first direction, the second direction and the third direction are pairwise perpendicular. According to the embodiments of the disclosure, the first direction is defined as an X-axis direction, the second direction is defined as a Y-axis direction, and the third direction is defined as a Z-axis direction.

With reference to FIG. 3C and FIG. 3E, operation S202 is then performed to form a second mask layer having a first mask pattern on the surface of the first mask layer. According to some embodiments, operation S202 includes the following operations.

A second mask layer is formed on the surface of the first mask layer.

According to some embodiments, the second mask layer includes a hard mask layer, a barrier layer, and an insulating layer that are stacked in sequence and may be formed by the following operations.

A hard mask layer is deposited on side walls of the first mask layer.

The hard mask layer may be a Spin-On Hard Mask (SOH) or any other hard mask layer.

According to the embodiments of the disclosure, the side walls include all side walls of the first mask layer. According to the embodiments of the disclosure, the hard mask layer is formed on all side walls of the first mask layer, and the hard mask layer is configured to fill internal gaps of the first mask layer, so that the first mask layer is provided with a flat surface.

On the surface of the first mask layer deposited with the hard mask layer, a barrier layer and an insulating layer are deposited in sequence, so as to form the second mask layer.

According to some embodiments, the barrier layer may be a SiON layer and the insulating layer may be a $SiO_2$ layer. According to the embodiments of the disclosure, the barrier layer and the insulating layer may be deposited through any one of the following processes: Chemical Vapor Deposition (CVD), Physical Vapor Deposition (PVD), Atomic Layer Deposition (ALD), or any other suitable deposition process.

FIG. 3C illustrates a schematic structural diagram of forming the second mask layer according to the embodiments of the disclosure. As shown in FIG. 3C, the second mask layer is formed on the surface of the first mask layer 202, and the second mask layer includes the hard mask layer 2031, the barrier layer 2032 and the insulating layer 2033 deposited in sequence.

A first mask pattern is formed in the second mask layer by adopting a mask having the first mask pattern.

According to some embodiments, the operation of forming a first mask pattern in a second mask layer by adopting a mask having the first mask pattern may include the following operations.

A photoresist layer is formed on the surface of the insulating layer.

The first mask pattern is formed in the photoresist layer by adopting the mask.

The insulating layer is etched based on the first mask pattern to form the first mask pattern in the second mask layer.

FIG. 3D illustrates a schematic structural diagram of forming the first mask pattern in the second mask layer according to the embodiments of the disclosure. FIG. 3E illustrates a diagram from top view and a cross-sectional structural diagram of forming the first mask pattern in the second mask layer according to the embodiments of the disclosure. The left figure in FIG. 3E illustrates the diagram from top view, and the right figure in FIG. 3E illustrates the cross-sectional diagram along a dashed line c-c'. As shown in FIG. 3D and FIG. 3E, the insulating layer 2033 is etched based on the photoresist layer having the first mask pattern to form the first mask pattern 30 in the insulating layer 2033. According to the embodiments of the disclosure, the first mask pattern 30 includes multiple first sub-patterns arranged in sequence in the X-axis direction and multiple first sub-patterns arranged in sequence in the Y-axis direction, each of the first sub-patterns may be an etched hole 301, the etched hole 301 may penetrate the insulating layer 2033, and the bottom of the etched hole 301 may also be located at the inner side of the insulating layer 2033.

With reference to FIGS. 3F to 3L, operation S203 is then performed to form a second mask pattern in the second mask layer through the first mask pattern in a self-alignment manner.

According to some embodiments, the operation of forming, in a second mask layer, a second mask pattern through a first mask pattern in a self-alignment manner may include the following operations.

First material pillars having a preset height are formed through the first mask pattern.

According to the embodiments of the disclosure, the operation of forming the first material pillars having the preset height through the first mask pattern includes the following operations.

A first material is deposited in first etched holes to form multiple first material pillars.

The first material may be any material having a high etching selection ratio relative to an insulating material of the insulating layer; for example, the first material may be silicon nitride, and the insulating material of the insulating layer may be silicon oxide.

According to the embodiments of the disclosure, the first material may be deposited in the first etched holes through an ALD process to form the multiple first material pillars. The reaction gas for forming the first material pillars includes at least one of ammonia gas or nitrogen-hydrogen mixture gas in addition to a silicon source.

FIG. 3F illustrates a schematic structural diagram of forming the first material pillars according to the embodiments of the disclosure. As shown in FIG. 3F, a silicon nitride material is filled in the etched holes 301 to form the first material pillars 302.

According to some embodiments, after the first material pillars are formed, Chemical Mechanical Polishing (CMP) is performed on the surface of the insulating layer and the surfaces of the first material pillars, so that the surfaces of the first material pillars are flush with the surface of the insulating layer.

Etching is performed to remove the insulating layer by a partial thickness, so as to form the first material pillars having a preset height.

FIG. 3G illustrates a schematic structural diagram of forming the first material pillars having the preset height according to the embodiments of the disclosure. As shown in FIG. 3G, a partial thickness of the insulating layer is removed through etching by adopting a dry etching technology in the Z-axis direction to form the first material pillars 3021 having the preset height.

Due to the fact that the first material forming the first material pillars has a high etching selection ratio compared with the insulating material forming the insulating layer, only a part of the insulating material is etched without etching the first material pillars by adjusting the selection ratio of the gas for etching.

According to the embodiments of the disclosure, the preset height is less than an initial height of the first material pillars. According to some embodiments, the ratio of the preset height to the initial height is greater than or equal to 75%, and is less than or equal to 80%. Thus, sufficient etching redundancy can be ensured when diamond-shape holes formed subsequently are etched into circular holes, and the roundness of the circular holes formed by etching can be ensured.

The second mask pattern is formed through the first material pillars having the preset height in a self-alignment manner.

According to some embodiments, the operation of forming a second mask pattern through first material pillars having a preset height in a self-alignment manner may include the following operations.

An insulating material is deposited on the surfaces of the first material pillars having the preset height to form insulating material pillars.

The insulating material pillars and the insulating layer include the same insulating material, and for example, the insulating material may be $SiO_2$. According to the embodiments of the disclosure, the insulating material pillars may be formed through an ALD process.

FIG. 3H illustrates a schematic structural diagram of forming the insulating material pillars according to the embodiments of the disclosure. As shown in FIG. 3H, the insulating material pillars 303 are formed on the surfaces of the exposed first material pillars 3021 having the preset height. Any two adjacent insulating material pillars among the insulating material pillars are in contact with each other.

Etching is performed to remove the insulating material pillars by a partial thickness until the first material pillars are exposed.

FIG. 3I illustrates a schematic structural diagram of etching the insulating material pillars according to the embodiments of the disclosure. As shown in FIG. 3I, the insulating material pillars 303 are etched in the Z-axis direction until the surfaces of the first material pillars 3021 are exposed.

According to some embodiments, the insulating material pillars may also be polished through a CMP process, and the polishing is stopped when the surfaces of the first material pillars are exposed.

With further reference to FIG. 3I, according to the embodiments of the disclosure, every four insulating material pillars 303 that are pairwise adjacent may be self-aligned to form a diamond-shape hole 304'.

The insulating material pillars and the first material pillars are etched simultaneously until the diamond-shape holes are turned into circular holes.

The operation of etching the insulating material pillars and the first material pillars simultaneously includes: etching the insulating material pillars and the first material pillars simultaneously through dry etching. The gas for dry etching includes at least one selected from the group consisting of sulfur hexafluoride, carbon tetrafluoride, trifluoromethane, oxygen, and argon.

According to the embodiments of the disclosure, the dry etching technology may be a plasma etching technology.

FIG. 3J illustrates a schematic structural diagram of etching the insulating material pillars and the first material pillars simultaneously according to the embodiments of the disclosure. As shown in FIG. 3J, the insulating material pillars 303 and the first material pillars 3021 are etched simultaneously by adopting the dry etching technology in the Z-axis direction. As the etching depth gradually increases, each diamond-shape hole 304' located in the middle of every four insulating material pillars that are pairwise adjacent is gradually turned into a circular hole 304".

Second sub-patterns are formed in the insulating layer through the circular holes.

According to the embodiments of the disclosure, each of the second sub-patterns includes a second etched hole having a preset diameter, and a projection region of the second etched hole is located in the first mask layer.

FIG. 3K illustrates a schematic structural diagram of forming the second etched holes having the preset diameter according to the embodiments of the disclosure. As shown in FIG. 3K, the insulating layer 2033 is etched with the circular holes as an etching pattern, and the second etched holes 304 corresponding to the circular holes are formed in the insulating layer 2033, and the insulating material and the first material pillars are continuously etched simultaneously. When the second etched holes have the preset diameter, the etching is stopped and the second sub-patterns are formed. Therefore, the second etched holes 304 corresponding to the first etched holes are formed through the first sub-patterns in a self-alignment manner.

The first material in the etched holes is removed to form the second mask pattern including the etched holes and the circular holes.

FIG. 3L illustrates a schematic structural diagram of etching to remove the first material in the etched holes according to the embodiments of the disclosure. As shown in FIG. 3L, the first material in the first etched holes 301 is removed through a dry etching process to form the second mask pattern 305 including the first etched holes 301 and the second etched holes 304.

With reference to FIG. 3M and FIG. 3N, operation S204 is then performed to etch the first mask layer based on the first sub-patterns and the second sub-patterns of the second mask pattern to convert the preset pattern into the active area pattern.

According to some embodiments, the operation of etching the first mask layer based on the first sub-patterns and the second sub-patterns of the second mask pattern to convert the preset pattern into the active area pattern includes the following operation.

A barrier layer is etched based on the first sub-patterns and the second sub-patterns of the second mask pattern to transfer the first sub-patterns and the second sub-patterns of the second mask pattern into the barrier layer.

FIG. 3M illustrates a schematic structural diagram of etching the barrier layer according to the embodiments of the disclosure. As shown in FIG. 3M, the barrier layer is etched based on the first sub-patterns and the second sub-patterns of the second mask pattern to form the etched barrier layer 2032'. The etched barrier layer 2032' is provided with the second mask pattern.

The hard mask layer and the first mask layer are etched with the etched barrier layer as an etching mask to convert the preset pattern into the active area pattern.

According to some embodiments, after the preset pattern is converted into the active area pattern, the forming method of the semiconductor structure further includes the operation of etching to remove the second mask layer.

According to the embodiments of the disclosure, the second mask layer may be removed through a dry etching technology or a wet etching technology.

FIG. 3N illustrates a schematic structural diagram of forming the active area pattern according to the embodiments of the disclosure. As shown in FIG. 3N, the hard mask layer and the first mask layer are etched by adopting the etched barrier layer as the etching mask, and the second mask layer is removed to convert the preset pattern into the active area pattern 306.

With reference to FIG. 3O and FIG. 3P, operation S205 is then performed to define the active areas in the semiconductor substrate based on the active area pattern.

According to some embodiments, an isolation layer is formed between the semiconductor substrate and the first mask layer, and the operation of defining the active areas in the semiconductor substrate based on the active area pattern includes the following operations.

The isolation layer is etched based on the active area pattern to transfer the active area pattern into the isolation layer.

FIG. 3O illustrates a schematic structural diagram of etching the isolation layer according to the embodiments of the disclosure. As shown in FIG. 3O, the isolation layer is etched based on the active area pattern 306 to form the etched isolation layer 201'. The etched isolation layer 201' is provided with the active area pattern 306.

The semiconductor substrate is etched using the etched isolation layer as an etching mask to form the active areas in the semiconductor substrate.

FIG. 3P illustrates a schematic structural diagram from cross-sectional view of forming the active areas in the semiconductor substrate according to the embodiments of the disclosure. As shown in FIG. 3P, the semiconductor substrate 200 is etched using the etched isolation layer as the etching mask, and the etched isolation layer is removed to form the active areas 204 in the semiconductor substrate.

According to the forming method of the semiconductor structure and the semiconductor structure provided by the embodiments of the disclosure, the second mask layer having the first mask pattern is formed on the surface of the first mask layer having the preset pattern, the first mask pattern includes multiple first sub-patterns arranged in sequence; the second mask pattern is formed in the second mask layer through the first mask pattern in a self-alignment manner, the second mask pattern includes the first sub-pattern of the first mask pattern and the second sub-patterns corresponding to the first sub-patterns; then, the first mask layer is etched based on the first sub-patterns and the second sub-patterns of the second mask pattern to convert the preset pattern into the active area pattern, and then the active areas are defined in the semiconductor substrate based on the active area pattern. Due to the fact that the second mask pattern is formed through the first mask pattern in a self-alignment manner, the malposition and connection between the formed adjacent active areas are avoided.

According to some embodiments, the first mask layer having the preset pattern is formed by the following operations.

An isolation layer, a first mask layer, a third mask layer and a fourth mask layer are deposited on the surface of the semiconductor substrate in sequence. The first mask layer may be a polysilicon layer, the third mask layer includes a SOH layer and a silicon oxynitride layer that are stacked in sequence, and the fourth mask layer has the same structure as the third mask layer.

Figure 4A:
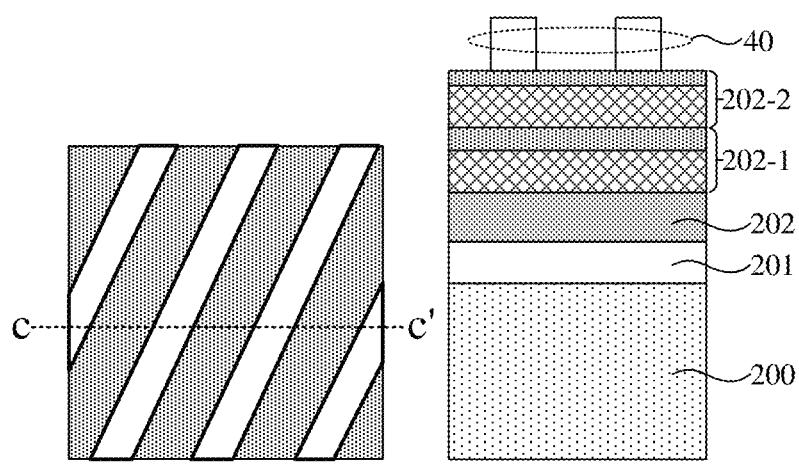
FIG. 4A illustrates a schematic structural diagram of forming an initial structure of a first mask layer having a preset pattern according to an embodiment of the disclosure.

FIG. 4A illustrates a schematic structural diagram of forming an initial structure of the first mask layer having the preset pattern according to the embodiments of the disclosure. The left figure in FIG. 4A illustrates a diagram from top view of the initial structure, and the right figure in FIG. 4A illustrates a cross-sectional diagram of the initial structure along a dashed line c-c'. As shown in FIG. 4A, the isolation layer 201, the first mask layer 202, the third mask layer 202-1, and the fourth mask layer 202-2 are deposited on the surface of the semiconductor substrate 200 in sequence. An initial active area mask 40 is arranged on the initial structure, and the initial active area mask 40 is configured to form active areas.

The fourth mask layer on the surface of the semiconductor substrate is etched by adopting the initial active area mask to transfer a pattern of the initial active area mask into the fourth mask layer.

Figure 4B:
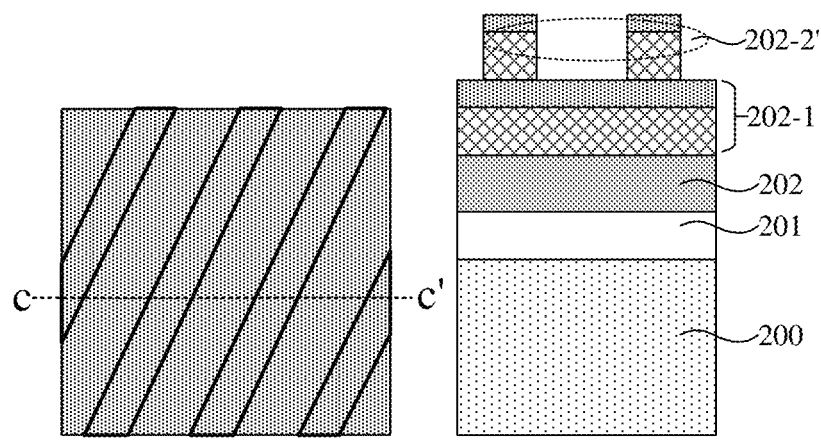
FIG. 4B illustrates a schematic structural diagram of etching a fourth mask layer according to an embodiment of the disclosure.

FIG. 4B illustrates a schematic structural diagram of etching the fourth mask layer according to the embodiments of the disclosure. The left figure in FIG. 4B illustrates a diagram from top view of the structure formed after the fourth mask layer is etched, and the right figure in FIG. 4B illustrates a cross-sectional diagram of the structure formed after the fourth mask layer is etched along a dashed line c-c'. As shown in FIG. 4B, the fourth mask layer 202-2 is etched through the initial active area mask, and an initial active area pattern on the initial active area mask is transferred into the fourth mask layer to form the etched fourth mask layer 202-2'. The etched fourth mask layer 202-2' is provided with the pattern of the initial active area mask.

An insulating material is deposited on the surface of the etched fourth mask layer to form a first isolation side wall.

Figure 4C:
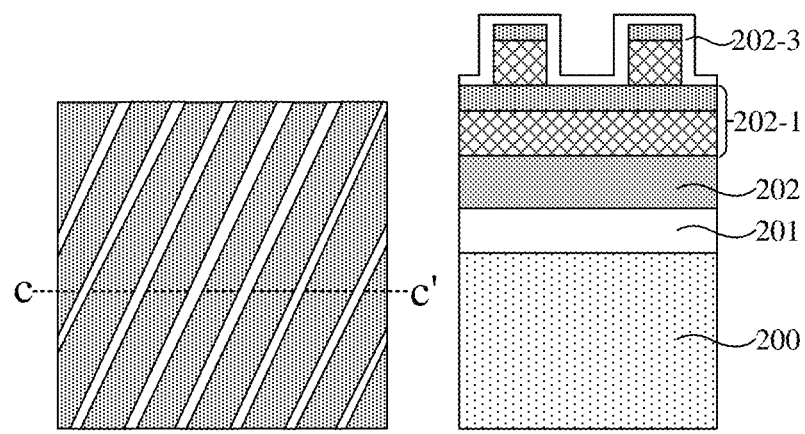
FIG. 4C illustrates a schematic structural diagram of forming a first isolation side wall according to an embodiment of the disclosure.

FIG. 4C illustrates a schematic structural diagram of forming the first isolation side wall according to the embodiments of the disclosure. The left figure in FIG. 4C illustrates a diagram from top view of the structure formed after the first isolation side wall is formed, and the right figure in FIG. 4C illustrates a cross-sectional diagram of the structure formed after the first isolation side wall is formed along a dashed line c-c'. As shown in FIG. 4C, the first isolation side wall 202-3 is formed on the surface of the etched fourth mask layer 202-2'. The first isolation side wall may be formed through any suitable deposition process.

The third mask layer is etched through the first isolation side wall to transfer a first isolation side wall pattern into the third mask layer.

Figure 4D:
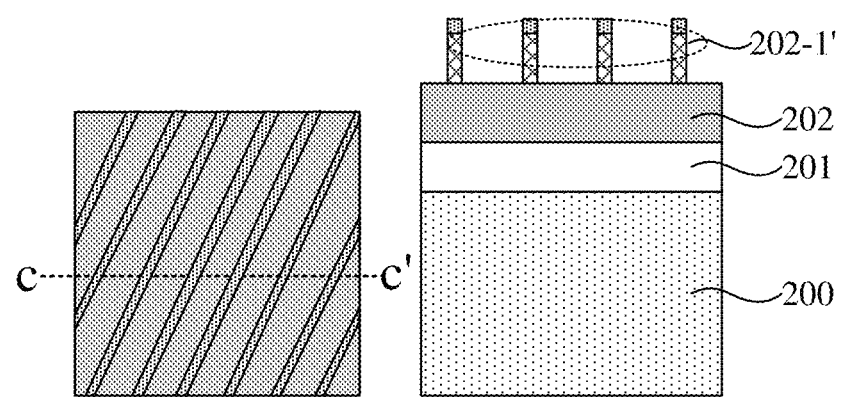
FIG. 4D illustrates a schematic structural diagram of etching a third mask layer according to an embodiment of the disclosure.

FIG. 4D illustrates a schematic structural diagram of etching the third mask layer according to the embodiments of the disclosure. The left figure in FIG. 4D illustrates a diagram from top view of the structure formed after the third mask layer is etched, and the right figure in FIG. 4D illustrates a cross-sectional diagram of the structure formed after the third mask layer is etched along a dashed line c-c'. As shown in FIG. 4D, the third mask layer 202-1 is etched using the first isolation side wall on the side wall of the initial active area pattern as a new mask pattern to transfer the first isolation side wall pattern into the third mask layer, so as to form the etched third mask layer 202-1'.

An insulating material is deposited on the surface of the etched third mask layer to form a second isolation side wall.

Figure 4E:
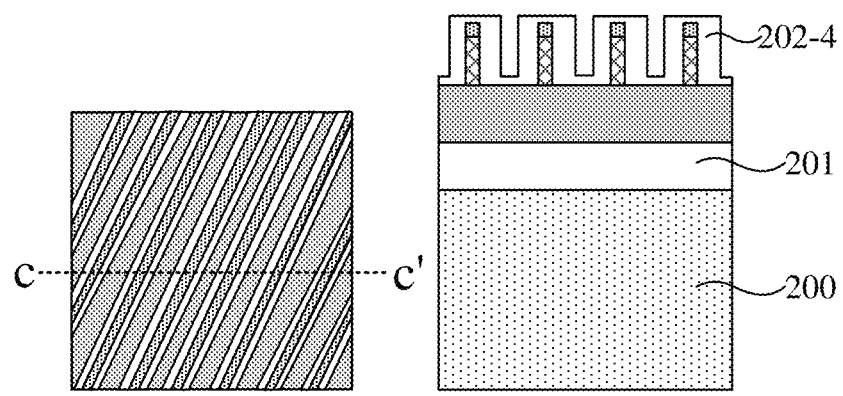
FIG. 4E illustrates a schematic structural diagram of forming a second isolation side wall according to an embodiment of the disclosure.

FIG. 4E illustrates a schematic structural diagram of forming the second isolation side wall according to the embodiments of the disclosure. The left figure in FIG. 4E illustrates a diagram from top view of the structure formed after the second isolation side wall is formed, and the right figure in FIG. 4E illustrates a cross-sectional diagram of the structure formed after the second isolation side wall is formed along a dashed line c-c'. As shown in FIG. 4E, the second isolation side wall 202-4 is formed on the surface of the etched third mask layer 202-1'. The second isolation side wall may be formed through any suitable deposition process.

The first mask layer is etched through the second isolation side wall to transfer a second isolation side wall pattern into the first mask layer.

Figure 4F:
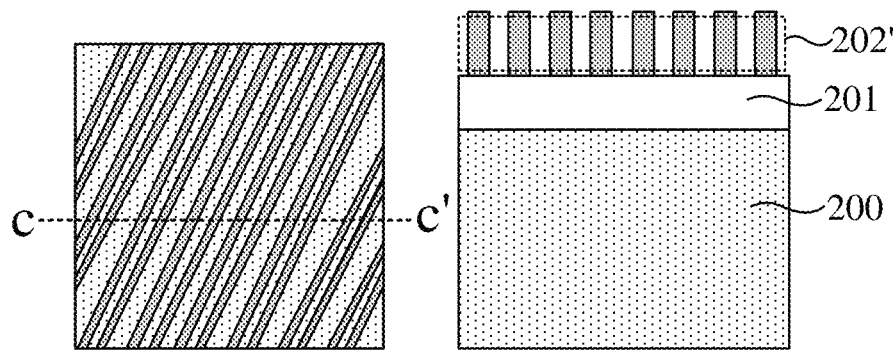
FIG. 4F illustrates a schematic structural diagram of etching a first mask layer according to an embodiment of the disclosure.

FIG. 4F illustrates a schematic structural diagram of etching the first mask layer according to the embodiments of the disclosure. The left figure in FIG. 4F illustrates a diagram from top view of the structure formed after the first mask layer is etched, and the right figure in FIG. 4F illustrates a cross-sectional diagram of the structure formed after the first mask layer is etched along a dashed line c-c'. As shown in FIG. 4F, the first mask layer 202 is etched using the second isolation side wall on the side wall of the first isolation side wall pattern as a new mask pattern to transfer the second isolation side wall pattern into the first mask layer, so as to form the etched first mask layer 202'. The second isolation side wall pattern is the preset pattern according to the embodiments of the disclosure.

According to some embodiments, the forming method of the semiconductor structure further includes the following operations.

Multiple word lines are formed, the multiple word lines are intersected with the multiple active areas in the word line extension direction.

Multiple bit lines are formed, the multiple bit lines are intersected with the multiple active areas in the bit line extension direction.

According to some embodiments, the active area is used to form a memory cell, the memory cell includes a transistor, the word line is connected to a gate electrode of the transistor, the word line is configured to provide a word line voltage, and the transistor is controlled to be turned on or turned off by the word line voltage. The bit line is connected to a source or a drain of the transistor, and the bit line is configured to perform a read operation or a write operation on the memory cell when the transistor is turned on.

According to some embodiments, word lines or bit lines are formed by forming metal lines at preset word line positions or preset bit line positions. The metal lines include, but are not limited to, tungsten (W), cobalt (Co), copper (Cu), aluminum (Al), polysilicon, doped silicon, silicide, or any combination thereof.

According to some embodiments, the memory cell further includes a storage capacitor. The forming method of the semiconductor structure further includes: forming the storage capacitor in the active area. One terminal of the storage capacitor is connected to the drain or source of the transistor, the other terminal of the storage capacitor is grounded, and the storage capacitor is configured to store data written into the memory cell.

According to the forming method of the semiconductor structure provided by the embodiments of the disclosure, only one mask is adopted to form the active areas, moreover, the etching pattern of the active areas is formed through a self-aligned process, so that malposition and connection between adjacent active areas among the formed multiple active areas are avoided, and therefore, the formed semiconductor structure has good electrical properties, and the yield of manufacturing semiconductor structures can be improved.

Figure 5:
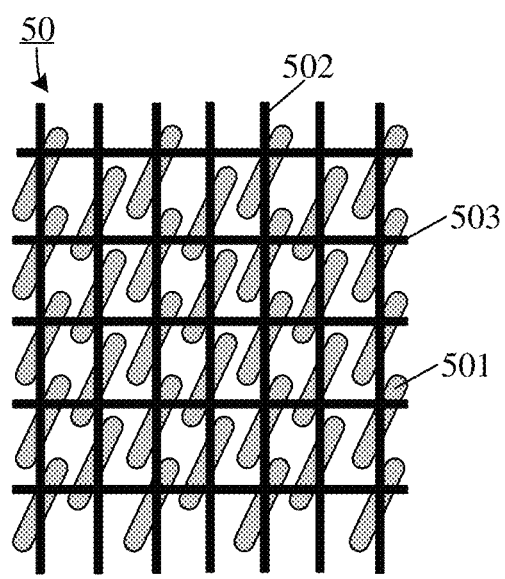
FIG. 5 illustrates an alternative schematic structural diagram of a semiconductor structure according to an embodiment of the disclosure.

In addition, embodiments of the disclosure further provide a semiconductor structure. FIG. 5 illustrates an alternative schematic structural diagram of the semiconductor structure according to the embodiments of the disclosure. As shown in FIG. 5, the semiconductor structure 50 includes multiple active areas 501, multiple bit lines 502 and multiple word lines 503.

The multiple active areas 501 are formed in the semiconductor substrate and the active areas are formed by the forming method of the semiconductor structure provided by the foregoing embodiments.

The multiple bit lines 502 are intersected with the multiple active areas in the bit line extension direction.

The multiple word lines 503 are intersected with the multiple active areas in the word line extension direction.

According to the embodiments of the disclosure, the active areas are configured to form active devices, such as transistors. The word lines are configured to control the active devices to be turned on or turned off, and the bit lines are configured to read data from or write data to the active devices.

According to some embodiments, the semiconductor structure further includes storage capacitors. The storage capacitors are configured to store data written to the memory cells.

The semiconductor structure according to the embodiment of the disclosure is similar to that formed by the forming method of the semiconductor structure provided by the foregoing embodiments. For technical features not disclosed in detail according to the embodiment of the disclosure, the reference can be made to the foregoing embodiments for understanding.

The semiconductor structure according to the embodiment of the disclosure includes multiple active areas, multiple word lines and multiple bit lines. Due to the fact that no malposition and connection occurs between two adjacent active areas among the multiple active areas, the formed semiconductor structure has good electrical properties and the yield of manufacturing semiconductor structures can be improved.

The foregoing are merely some embodiments of the disclosure, and the scope of the disclosure is not limited thereto. Variations or substitutions made by any person skilled in the art without departing from the technical scope of the disclosure should fall within the scope of the disclosure. Therefore, the scope of the disclosure should be defined by the scope of the claims.

What is claimed is:

1. A forming method of a semiconductor structure, comprising:

providing a semiconductor substrate, on which a first mask layer having a preset pattern is formed;

forming, on a surface of the first mask layer, a second mask layer having a first mask pattern, wherein the first mask pattern comprises a plurality of first sub-patterns arranged in sequence;

forming, in the second mask layer, a second mask pattern through the first mask pattern in a self-alignment manner, wherein the second mask pattern comprises the first sub-patterns of the first mask pattern and second sub-patterns corresponding to the first sub-patterns;

etching the first mask layer based on the first sub-patterns and the second sub-patterns of the second mask pattern to convert the preset pattern into an active area pattern; and defining, based on the active area pattern, a plurality of active areas in the semiconductor substrate.

2. The forming method according to claim 1, wherein the forming, on the surface of the first mask layer, the second mask layer having the first mask pattern comprises:

forming the second mask layer on the surface of the first mask layer; and forming the first mask pattern in the second mask layer by adopting a mask having the first mask pattern.

3. The forming method according to claim 2, wherein the second mask layer comprises a hard mask layer, a barrier layer, and an insulating layer that are stacked in sequence, and wherein the forming the second mask layer on the surface of the first mask layer comprises:

depositing the hard mask layer on side walls of the first mask layer; and depositing the barrier layer and the insulating layer in sequence on the surface of the first mask layer deposited with the hard mask layer, so as to form the second mask layer.

4. The forming method according to claim 3, wherein the forming the first mask pattern in the second mask layer by adopting the mask having the first mask pattern comprises:

forming a photoresist layer on a surface of the insulating layer;

forming the first mask pattern in the photoresist layer by adopting the mask; and etching the insulating layer based on the first mask pattern to form the first mask pattern in the second mask layer.

5. The forming method according to claim 1, wherein the second mask layer at least comprises an insulating layer, and the first mask pattern is formed in the insulating layer; and wherein the forming, in the second mask layer, the second mask pattern through the first mask pattern in the self-alignment manner comprises:

forming first material pillars having a preset height through the first mask pattern; and forming the second mask pattern through the first material pillars having the preset height in the self-alignment manner.

6. The forming method according to claim 5, wherein each of the first sub-patterns comprise a first etched hole, and a projection region of the first sub-pattern is located in the first mask layer; and wherein the forming the first material pillars having the preset height through the first mask pattern comprises:

depositing a first material in the first etched holes to form the first material pillars; and etching to remove the insulating layer by a partial thickness, so as to form the first material pillars having the preset height, the preset height being less than an initial height of the first material pillars.

7. The forming method according to claim 6, wherein a ratio of the preset height to the initial height is greater than or equal to 75%, and is less than or equal to 80%.

8. The forming method according to claim 6, wherein the forming the second mask pattern through the first material pillars having the preset height in the self-alignment manner comprises:
depositing an insulating material on surfaces of the first material pillars having the preset height to form insulating material pillars, wherein any two adjacent insulating material pillars among the insulating material pillars are in contact with each other;
etching to remove the insulating material pillars by a partial thickness, until the first material pillars are exposed, wherein every four insulating material pillars that are pairwise adjacent among the insulating material pillars are self-aligned to form a diamond-shape hole;
etching the insulating material pillars and the first material pillars simultaneously until the diamond-shape holes are turned into circular holes;
forming the second sub-patterns in the insulating layer through the circular holes, wherein each of the second sub-patterns comprises a second etched hole having a preset diameter, and a projection region of the second etched hole is located in the first mask layer; and
removing the first material in the first etched holes to form the second mask pattern comprising the first etched holes and the second etched holes.

9. The forming method according to claim 8, wherein the preset pattern comprises a plurality of third sub-patterns arranged in parallel, the plurality of third sub-patterns have a preset width in a first direction, the first direction is an arrangement direction of the plurality of third sub-patterns; and
the preset diameter is equal to the preset width.

10. The forming method according to claim 8, wherein the first material comprises silicon nitride, and the insulating material comprises silicon oxide; and
the first material pillars and the insulating material pillars are formed through an Atomic Layer Deposition process.

11. The forming method according to claim 8, wherein the etching the insulating material pillars and the first material pillars simultaneously comprises:
etching the insulating material pillars and the first material pillars simultaneously through dry etching, wherein gas for the dry etching comprises at least one selected from the group consisting of sulfur hexafluoride, carbon tetrafluoride, trifluoromethane, oxygen, and argon.

12. The forming method according to claim 3, wherein the etching the first mask layer based on the first sub-patterns and the second sub-patterns of the second mask pattern to convert the preset pattern into the active area pattern comprises:
etching the barrier layer based on the first sub-patterns and the second sub-patterns of the second mask pattern to transfer the first sub-patterns and the second sub-patterns of the second mask pattern into the barrier layer; and
etching, by using the etched barrier layer as an etching mask, the hard mask layer and the first mask layer to convert the preset pattern into the active area pattern.

13. The forming method according to claim 1, further comprises:
etching to remove the second mask layer after the preset pattern is converted into the active area pattern.

14. The forming method according to claim 1, wherein an isolation layer is formed between the semiconductor substrate and the first mask layer; and
the defining, based on the active area pattern, the plurality of active areas in the semiconductor substrate comprises:
etching the isolation layer based on the active area pattern to transfer the active area pattern into the isolation layer; and
etching, by using the etched isolation layer as an etching mask, the semiconductor substrate to form the plurality of active areas in the semiconductor substrate.

15. The forming method according to claim 1, further comprising:
forming a plurality of word lines, wherein the plurality of word lines are intersected with the plurality of active areas in a word line extension direction; and
forming a plurality of bit lines, wherein the plurality of bit lines are intersected with the plurality of active areas in a bit line extension direction.

16. A semiconductor structure, comprising:
the plurality of active areas, formed in the semiconductor substrate, wherein the plurality of active areas are formed by the forming method according to claim 1;
a plurality of word lines, wherein the plurality word lines are intersected with the plurality of active areas in a word line extension direction; and
a plurality of bit lines, wherein the plurality bit lines are intersected with the plurality of active areas in a bit line extension direction.

* * * * *